United States Patent
Schaper

(10) Patent No.: US 6,707,680 B2
(45) Date of Patent: Mar. 16, 2004

(54) SURFACE APPLIED PASSIVES

(75) Inventor: Leonard W. Schaper, Fayetteville, AR (US)

(73) Assignee: Board of Trustees of the University of Arkansas, Little Rock, AR (US)

(*) Notice: Subject to any disclaimer, the term of this patent is extended or adjusted under 35 U.S.C. 154(b) by 0 days.

(21) Appl. No.: 10/090,933

(22) Filed: Mar. 5, 2002

(65) Prior Publication Data

US 2002/0131254 A1 Sep. 19, 2002

Related U.S. Application Data

(63) Continuation-in-part of application No. 09/426,941, filed on Oct. 22, 1999, now abandoned.
(60) Provisional application No. 60/105,289, filed on Oct. 22, 1998.

(51) Int. Cl.[7] .................................................. H05K 7/10
(52) U.S. Cl. .................. 361/760; 361/763; 361/734; 361/766; 361/720; 257/762; 257/765; 257/677; 174/52.1
(58) Field of Search ................................ 361/760, 763, 361/766, 821, 734, 720, 748; 257/762, 765, 676, 677; 174/52.1

(56) References Cited

U.S. PATENT DOCUMENTS

| | | | | |
|---|---|---|---|---|
| 3,693,011 A | * | 9/1972 | De Vaux et al. ............ 250/83.3 |
| 4,577,214 A | | 3/1986 | Schaper ........................ 357/74 |
| 4,675,717 A | | 6/1987 | Herrero et al. ................ 357/71 |
| 4,896,937 A | | 1/1990 | Kraetsch et al. ............ 350/96.2 |
| 5,034,855 A | | 7/1991 | Komiyama .................. 361/416 |
| 5,212,406 A | * | 5/1993 | Reele et al. ................. 257/723 |
| 5,222,014 A | | 6/1993 | Lin ............................. 361/414 |
| 5,268,315 A | | 12/1993 | Prasad et al. ................. 437/31 |
| 5,311,057 A | * | 5/1994 | McShane .................... 257/676 |
| 5,386,343 A | | 1/1995 | Pao ............................. 361/761 |
| 5,410,107 A | | 4/1995 | Schaper ...................... 174/255 |
| 5,472,370 A | | 12/1995 | Malshe et al. ................ 451/41 |
| 5,509,599 A | | 4/1996 | Laue ...................... 228/180.21 |
| 5,604,673 A | | 2/1997 | Washburn et al. ........... 363/147 |
| 5,629,665 A | * | 5/1997 | Kaufmann et al. ........... 338/18 |
| 5,640,699 A | * | 6/1997 | Ralph ......................... 455/326 |
| 5,873,992 A | | 2/1999 | Glezen et al. ............... 205/159 |
| 5,973,932 A | * | 10/1999 | Nguyen ...................... 361/779 |
| 6,023,407 A | | 2/2000 | Farooq et al. ............... 361/303 |
| 6,271,578 B1 | * | 8/2001 | Mitwalsky et al. ......... 257/620 |

OTHER PUBLICATIONS

Technical Disclosure Bullentin, vol. 27, issue No. 11, p. 6791–6793.*

* cited by examiner

Primary Examiner—David Martin
Assistant Examiner—Hung Bui
(74) Attorney, Agent, or Firm—Head, Johnson and Kachigian

(57) ABSTRACT

Surface applied passive devices for use on electronic circuit boards are formed by applying layers of conductive, insulating, and other material to a thin polymer film carrier. The surface applied passives are thin enough to fit underneath standard integrated circuit packages in order to conserve space on the circuit board. Resistors, capacitors, inductors and other passive circuits may be formed on thin polymer films, less than 8 mils thick. This significantly aids in conserving space on an electronic circuit board.

10 Claims, 3 Drawing Sheets

SURFACE APPLIED PASSIVES

CROSS-REFERENCE TO RELATED APPLICATIONS

This application claims priority to and is a continuation-in-part of U.S. patent application Ser. No. 09/426,941, filed Oct. 22, 1999 ABN, which is a continuation-in-part of U.S. Provisional Application Ser. No. 60/105,289, filed Oct. 22, 1998.

STATEMENT REGARDING FEDERALLY SPONSORED RESEARCH OR DEVELOPMENT

Not applicable.

REFERENCE TO A SEQUENCE LISTING A TABLE, OR A COMPUTER PROGRAM LISTING COMPACT DISC APPENDIX

Not applicable.

BACKGROUND OF THE INVENTION

1. Field of the Invention

The present invention relates to electrical circuit components and to methods of fabrication or production of such components. More particularly, the present invention is directed to passive components (resistors, inductors, terminators and capacitors) built on a surface of a thin flexible polyimide film and attached face down to the surface of a printed wiring board with solder or conductive epoxy in such a way that other components, particularly integrated circuit (IC) packages, can be mounted above them. By "hiding" under the IC packages, the passive components reduce the amount of board surface required for electrical circuitry, without the board manufacturing complexity of a true integral passive process, that is, a process by which passive components are formed within the circuit board itself.

2. Prior Art

As printed circuit boards become increasingly complex, board density increases dramatically. This drives the value of board real estate to higher and higher levels. In conventional surface mount assembly, there is not a great deal of "unused" space. In some of the worst cases, passive components occupy 70% of board surface area, even though the size of individual passive components has decreased.

Because of rapid advances in silicon integration, passive components, even small surface mount varieties, are occupying a larger fraction of printed wiring board real estate, particularly in analog or mixed-signal applications. The need to reduce the space occupied by passives has prompted various development efforts in "integrated passives," (IP's) which would be buried in thin layers within the PWB itself. But this technology requires fundamental changes in the PWB manufacturing process.

An alternative is a capacitor, resistor, or combination passive network, which combines several passive components into one physical device that is smaller than the area occupied by the individual components. Conventional passive networks are currently built using a variety of techniques, including thin film deposition, on various substrates including ceramics, silicon, and glass. All of these have substantial thickness (>−0.020") and thus occupy printed wiring board (PWB) area, just as do other surface mount technology (SMT) devices and IC packages themselves. In some cases these passive networks can be combined with packaged or unpackaged ICs to further save PWB area.

U.S. Pat. No. 5,509,599 to Laue, discloses a method for securing a hybrid circuit onto a circuit board. Part of the disclosure describes patterning an array of resistors underneath a packaged, leaded integrated circuit, which is soldered to pads on the hybrid circuit. The resistor array is screen printed onto the hybrid substrate. Other discrete passive components can be attached to the hybrid surface with solder as well. This method requires a sequential assembly process; the IC package and other parts are first soldered to the hybrid substrate. Then the assembled hybrid is soldered to the PWB. The method also requires that the hybrid substrate be larger than the IC package, including the area occupied by IC package leads. Since the hybrid substrate is typically 0.020 inches–0.025 inches thick, the method also increases the height of the final assembly.

U.S. Pat. No. 6,023,407 discloses a structure designed to provide decoupling capacitance to an integrated circuit resting on top of it. While this does remove the decoupling capacitor from occupying additional PWB space, it requires a complicated ceramic construction capable of carrying all signal, power, and ground connections to the IC. It is designed to support an unpackaged, flip chip IC, not an IC in a conventional package. It also requires some form of sequential assembly, since the IC mounts to the passive device, not to the PWB itself.

U.S. Pat. No. 5,386,343 to Pao, discloses a method of placing various electric components underneath upper circuits by placing them in recesses or cavities within the PWB. This invention does not disclose any new types of circuitry. Furthermore, this invention requires additional processing of the PWB, which takes away PWB wiring area and thus decreases the PWB wiring capability.

U.S. Pat. No. 5,034,855 to Komiyana, discloses integrated circuits having capacitors underneath them. However, it does not describe any new type of process for making capacitors or other passive circuits. Furthermore, this invention requires the modification of leads from the integrated circuits by lengthening them so that a conventional capacitor may fit underneath the circuit. Because this requires specially designed integrated circuit packages, this greatly increases the cost of the product.

In contrast with the above-described prior art, the present invention does not require a costly sequential assembly process. The device is smaller in area than the IC package above it. It does not require that the circuits above the passive device have extended leads to provide room for the passive device; it is used with standard packaged ICs. Application of these SAP's (Surface Applied Passives) may be easily integrated into the standard existing process for manufacturing PWB's. It does not require any additional processing of the PWB.

BRIEF SUMMARY OF THE INVENTION

The present invention is directed to passive components; for example resistors, inductors, capacitors, and the like which are built on the surface of a thin flexible polyimide film and attached component side down to a surface of a printed wiring board (PWB) with solder or conductive epoxy in such a way that other components, particularly IC packages such as PLCC's, TSOP's, BGA's, CSP's, and SOIC's can be mounted thereabove. Passive components that once occupied PWB area can be replaced by SAP networks that only occupy the area under the unmodified IC packages.

The placement of the SAP's only involves the addition of the step of adding the SAP's prior to addition of the IC packages. Conventional board assembly equipment can be used to attach the SAP's following the solder application step of the process. SAP's may be soldered to the PWB terminal pads using the same solder paste printing thickness as other SMT components. Thus, incorporation of SAP's into the manufacture of circuit boards is an easy matter. This represents one of the advantages of the invention.

Attaching flexible films populated with passive devices on a PWB in accordance with the present invention leads to cost reduction in electronics manufacturing, miniaturization, lighter products, and better electrical performance. Standard surface mount technology (SMT) passive devices are typically the smallest components available. However, they are reaching their limits in electrical performance and their ability to save board surface area. Also, because of their small size, it becomes increasingly difficult and expensive to mount each device. Additionally, for SMT capacitors, parasitic resistance and inductance associated with the devices degrade electrical performance at higher frequencies. Because of the low profile of the surface applied passives (SAP's) of the present invention, a drastic reduction in board size is achieved by placing the passive flexible films or SAP's under existing leaded or unleaded IC packages. Using polymer films as substrates for these devices also provides other mechanical advantages. Because the polymer film is flexible, it can be mounted just about anywhere on any type of surface. By placing these devices closer to the packages for which they are needed, the full electrical advantages of these passives can be realized. This advantage can be fully appreciated in view of the fact that each IC, in many digital applications, is accompanied by one or more decoupling capacitors connected between the power supply and ground planes. By reducing the interconnect distance from the decoupling capacitor to the chip, the charge can be delivered at a much higher rate.

Not only will the size and electrical performance of circuits be improved by using SAP's, the cost will be directly affected also. Decreased board costs result from reduction in the area required for the devices. Assembly costs are reduced not only by the ease of attaching a single device with many passive components to the printed wiring board (PWB), but also with the efficiency with which the connections are made.

By attaching these thin film devices or SAP's to the surface of the PWB, most of the advantages seen in embedding these devices in the substrate are retained. However, SAP's offer an advantage that is not seen by embedding: rework capabilities. If a device is embedded into the substrate, all possibilities to correct a problem or a bad device are lost. If the device is a freestanding device located on the surface of the PWB (or underneath an IC package), it is still possible to replace a defective part. Thus, the defective SAP can be replaced and the PWB need not be thrown away. If the defective component is embedded in the board, the PWB must be scrapped.

Also, if the SAP's were embedded in the board, the PWB could not undergo all of the usual PWB testing procedures as the SAP could be destroyed by high current or voltage board testing.

Since most boards support, and will continue to support, leaded devices such as thin small outline packages (TSOP's) or quad flat packs (QFP's), peripheral row ball grid arrays (BGA's), chip scale packages (CSP's), or even wire bonded bare chips, the board area under these devices is available for very thin passives. These surface applied passives (SAP's) can be connected to pads on the PWB with conductive epoxy, sintering metal paste, or solder. They perform the same area multiplexing function as integrated passives without major process changes in board fabrication. SAP's are cheaper to produce since the film does not have to incorporate thru-connections and double-sided processing. They can also be used with flex boards or conventional PWB's.

DETAILED DESCRIPTION OF THE PREFERRED EMBODIMENTS

Figure 1:
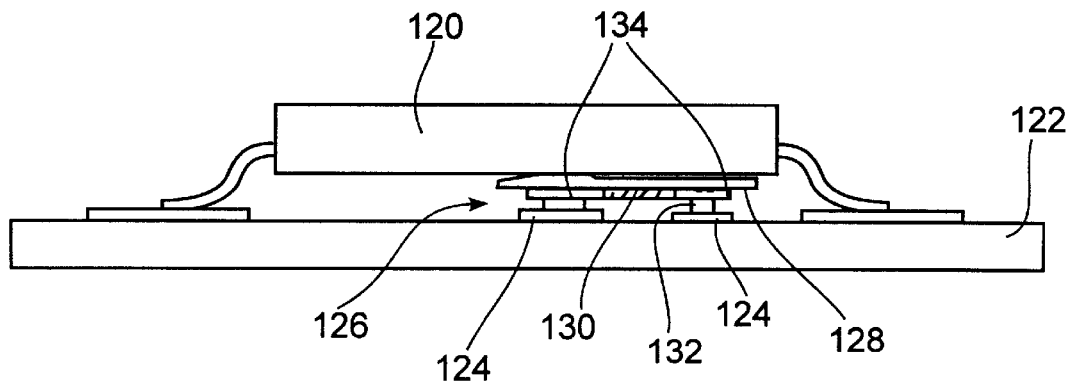
FIG. 1 is a side diagrammatic view of a capacitor SAP.

List of Acronyms:
SAP SURFACE APPLIED PASSIVE
IP INTEGRATED PASSIVES
IC INTEGRATED CIRCUIT
TSOP THIN SMALL OUTLINE PACKAGE
QFP QUAD FLAT PACK
CSP CHIP SCALE PACKAGE
BGA BALL GRID ARRAY
PFD PASSIVE FILM DEVICE
PWB PRINTED WIRING BOARD
PQFP PLASTIC QUAD FLAT PACK
CPT COMPUTER PACKAGING TECHNOLOGY
PCB PRINTED CIRCUIT BOARD
SMD SURFACE MOUNTED DEVICE
SMT SURFACE MOUNT TECHNOLOGY
BCB BENZOCYCLOBUTENE The present invention provides extremely thin passive electronic circuits. Leaded IC packages are generally about 0.008 inches, or 8 mils, above the surface of a circuit board, held above the PWB by their leads. BGA packages can have a higher spacing, but probably less than 20 mils. This small amount of space between the IC package and the board is empty and unused. By providing circuits less than 8 mils thick, the invention may be placed between the IC package and the PWB. This provides very efficient use of the area on the circuit board. Because these thin circuits are on a polymer film on top of the board, they may be removed if defective. This is an improvement over circuitry that is integrated into the board itself, which may not be removed. It also requires no modifications to the leads on the circuit above it, and may be incorporated directly into current manufacturing processes. Standard manufacturing equipment may be readily adapted to add these surface applied passives (SAP's) to circuit boards during the manufacturing process.

SAP's are formed on a thin polymer film. Although the present invention is described as being applied to a polymide film, a wide variety of substrates are suitable. These include any number of flexible polymer films, including but not limited to mylar, polyester, liquid crystal polymer, PVC, Teflon, and nylon. Those skilled in the art will appreciate that there are many suitable films. So long as the films are extremely thin, susceptible to layering conductive and insulative materials and non-conductive, they will be suitable.

The SAP's of the present invention may be placed under almost any surface mount device (SMD), so long as it is at least 6 mils above the surface of the circuit board. These include leaded IC packages, ball grid arrays, land grid arrays, area array packages or a bare wire bonded chip. In the last case the bare IC chip is die bonded to the back of the SAP.

Because the substrate film is flexible, differences in coefficient of thermal expansion between various components and the substrate do not have a deleterious effect on these SAP's. This is because the substrate may flex as heat affects the various components. Therefore, underfill is not required. This not only simplifies the manufacturing process, but also allows for later removal of a SAP if it becomes defective.

As mentioned above, IC package bodies are about 8 mils above the surface of the circuit board. It is preferred to have at least a 1 mil (0.001 of an inch or 0.025 mm) standoff between the back of the SAP and the underside of the IC package covering the SAP. Although a 1 mil standoff is preferred to prevent damage to the SAP or IC package during fabrication, it may not be required. This means that a SAP is preferably less than 7 mils thick. More preferably, the SAP and its attachment will be between 4 and 6 mils thick. By using sputtering to apply Cu, Al, Ta, Au, CrSi or other conductive metals, and tantalum oxidation, photolithography, and various chemical etches to form dielectric, conductor, and resistor features, it is possible to form passive circuits on a polyimide film with the total thickness of the device being less than 4 mils thick.

FIG. 1 shows a diagrammatic side view of the invention 126. The SAP 126 has carrier film 128 onto which dialectric 130 and copper bands 134 have been patterned. Gold contact pads 132 have been patterned onto copper bands 134. Gold contact pads are seated on top of printed circuits 124. SAP 126 lies underneath leaded surface 120 and rests on circuit board 122. SAP 126 is less than 8 mils thick and therefore easily lies between circuit 120 and board 122. By being placed in the unused space between circuit 120 and board 122, the invention greatly conserves space on board 122.

Figure 2:
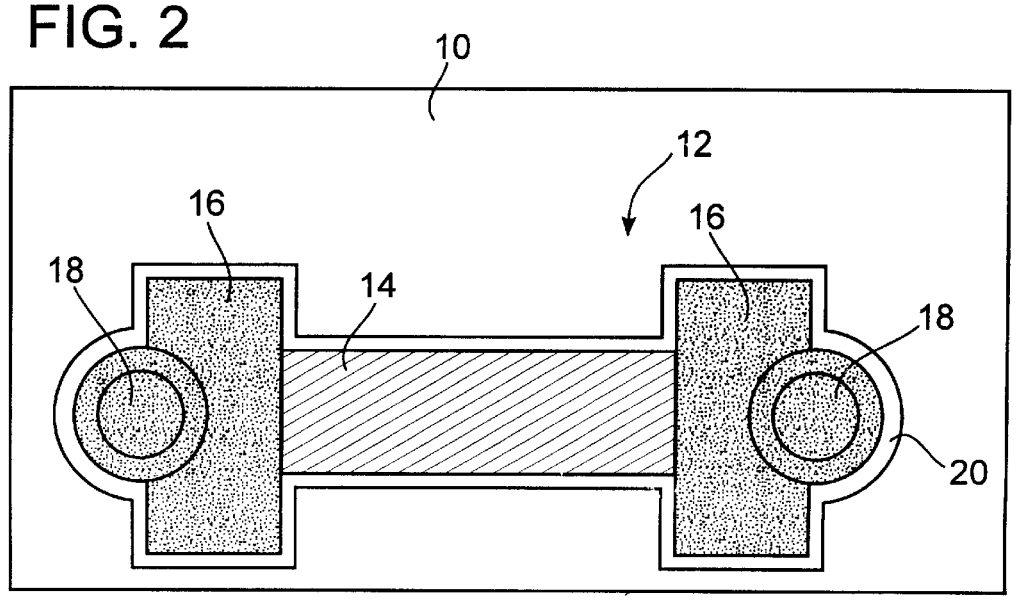
FIG. 2 is a top plan diagrammatic view of a resistor SAP.

Resistors are a common passive circuit element that can be fabricated on SAP's. FIG. 2 shows a top plan schematic view of a resistor SAP. Resistor 12 has been formed on polyimide carrier film 10. Resistive layer 14 is a chrome silicide film that has been applied and patterned using standard etching processes. The copper terminal areas 16 were etched using standard processes. In order to improve the solderability of the SAP to the PWB, gold contact pads 18 can be plated on the copper terminal areas. The gold is plated on top of the copper and acts as a barrier against oxidation and also a better surface for solder to attach. This guarantees good yield in the soldering process.

The insulating protective cover coat layer (and solder pad definition material) 20 can be printed or photo-defined polyimide, epoxy, BCB, solder mask material, or the like. In some cases a protective coat may not be necessary. For example, when using a conductive epoxy to attach the SAP to the PWB a cover coat is not required to contain the epoxy.

Figure 3:
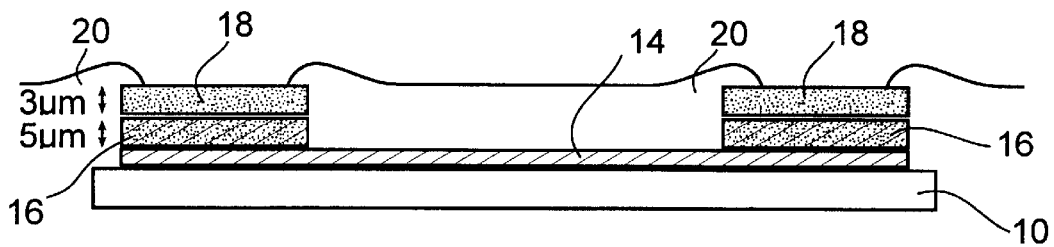
FIG. 3 is a side diagrammatic view of a resistor SAP.

A side view of the SAP resistor is shown in FIG. 3. Gold contact pad 18 is approximately 0.3 $\mu$m thick and copper terminal area 16 is about 5 $\mu$m thick. Carrier film 10 may be about 25–50 $\mu$m thick. 1 mil is equal to approximately 25 $\mu$m. Therefore, the resistor SAP shown here could be significantly thicker and still easily fit underneath an IC package.

The resistor material can be CrSi, or alternatively NiCr, SiN, carbon, polymer thick film inks, resistive particles in epoxy, and the like. The resistor shown in FIGS. 2 and 3 is produced using standard sputtering and etching techniques. Resistors may also be formed by screen printing conventional polymer thick film resistor inks, which come in a range of resistor values, on the polymer film SAP substrate.

Figure 4:
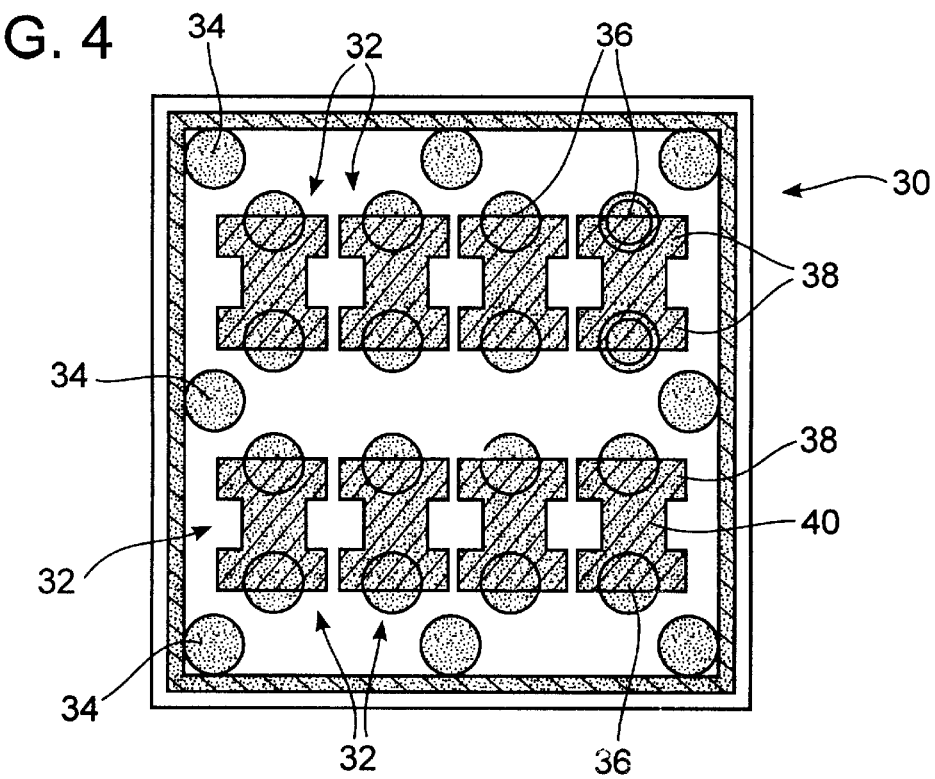
FIG. 4 is a top plan view of an array of resistors on a SAP.

FIG. 4 shows a diagram of an array of 8 resistors on SAP 30. Carrier film 30 has resistors 32 and attachment pads 34 printed. Attachment pads 34 are made of gold and designed to attach to solder points, but are not intended to conduct electricity. They are only intended to firmly anchor the SAP in place. Resistors 32 have gold contact pads 36, copper terminal areas 38 and resistive layer 40 that were manufactured in the same manner as the single resistor of FIGS. 2 and 3. SAP 30 is approximately 4 mm by 4 mm. Larger SAP's may easily be designed having many more resistors.

Figure 5:
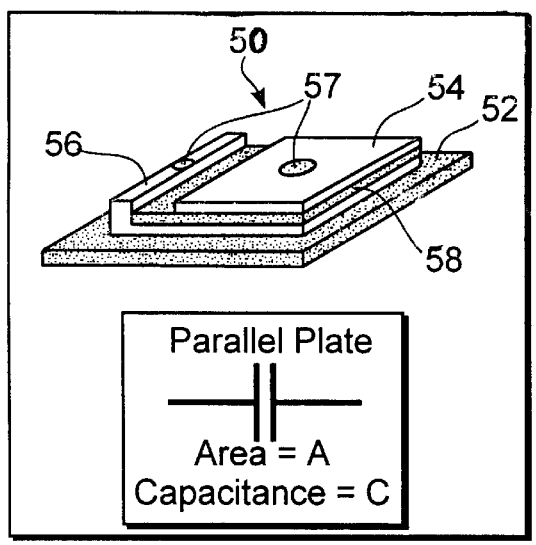
FIG. 5 is a perspective diagrammatic view of a parallel plate capacitor SAP.

Capacitors, like resistors, are passive circuits that are well suited to be incorporated into SAP's. FIG. 5 is a perspective diagrammatic view of a parallel plate capacitor SAP. SAP 50 is built on carrier film 52 and has a bottom plate 56 and a top plate 54. Of course, when the SAP 50 is applied to a circuit board, it will be inverted so that top plate 54 is actually underneath bottom plate 56. Plates 54 and 56 can be comprised of copper, gold, aluminum or any other conductive metal. Dielectric layer 58 is comprised of an insulating material, chosen for its dielectric properties. FIG. 5 also shows optional gold contact pads 57. It may be desirable to apply contact pads 57 to aid in adhesion to solder points on a circuit board. Suitable capacitor dielectrics include $SiO_2$, $Al_2O_3$, $Ta_2O_5$, barium titanate powder in organic curable paste, BCB, polyimide, as well as other inorganic or organic dielectrics well known to those skilled in the art.

Figure 6:
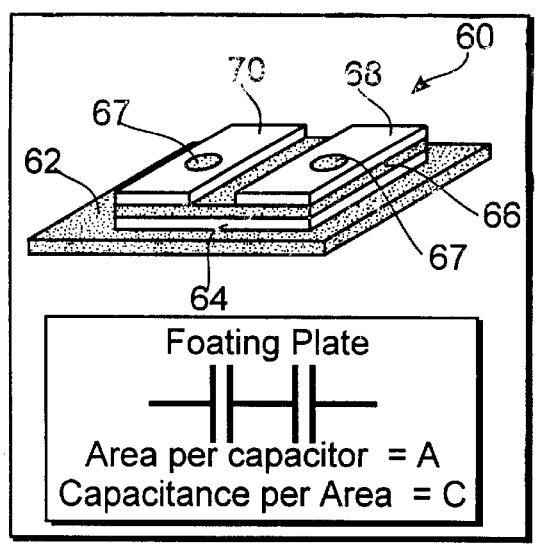
FIG. 6 is a perspective diagrammatic view of a floating plate capacitor SAP.

SAP capacitors can also be floating plate type capacitors (one large floating plate covered by two smaller real plates making what is really two capacitors in series) like the one shown in FIG. 5. Floating plate capacitor SAP 60 is manufactured on carrier film 62. Bottom floating plate 64 is comprised of a conductive metal, as are top plates 68 and 70. One advantage of this embodiment is that no patterning of capacitor dielectric 66 is necessary. Plates 64, 68 and 70 may be formed by sputtering Cu or Al or the bottom floating plate 64 can be Cu foil laminated to flex. The dielectric 66 can be an applied and cured dielectric paste, such as a mixture of epoxy and barium titanate particles. The dielectric 66 can also be a sputtered dielectric or CVD SiO2. Dielectric 66 can even be a polymer such as polyimide or BCB, which is useful for making low value (less than 100 pF capacitors). The top plates 68 and 70 can be formed by sputtering Cu, printed Cu paste, or the like. As with FIG. 5, FIG. 6 shows optional gold contact pads 67 located on top plates 68 and 70. These may be desirable to aid in attachment to a circuit board.

Tantalum may also be used to form capacitors. A layer of tantalum may be applied to the carrier film. It is then partially oxidized. The tantalum oxide forms a dielectric layer, and the unanodized tantalum forms a bottom plate. A second plate is then layered on the tantalum oxide. By patterning the oxidation, a single capacitor may be formed. Floating capacitors are also easily formed by this method. It is often desirable to apply a thin titanium adhesion layer to the tantalum oxide layer to provide for good adhesion between the tantalum oxide dielectric and the second plate.

Passivation layers may be applied to SAP capacitors just as they are to resistor SAP's. Those skilled in the art will appreciate that such passivation layers will need to be patterned to allow a conductive connection between the capacitor plates and the circuit board.

FIGS. 5 and 6 illustrate capacitor SAP's having only one capacitor. Those skilled in the art will appreciate that, as with the resistor SAP shown in FIG. 4, multiple capacitors may be manufactured onto a single SAP.

Figure 7:
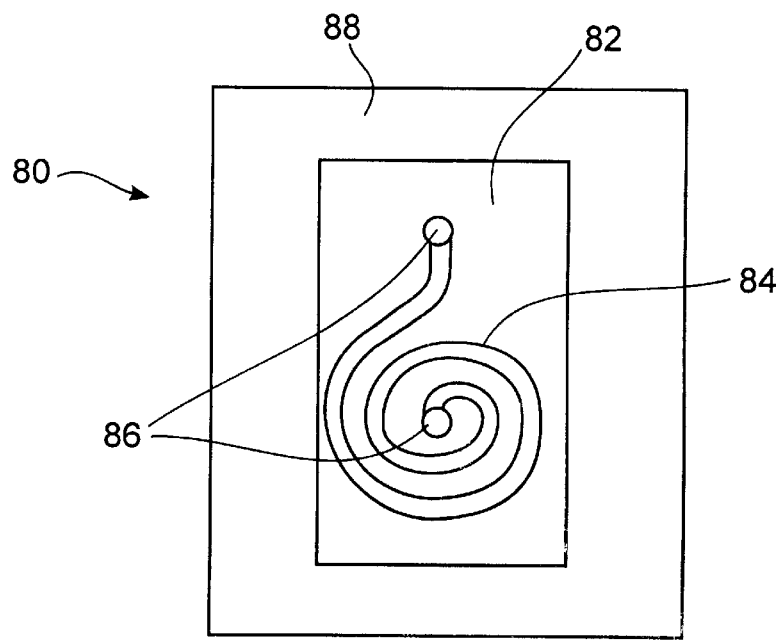
FIG. 7 is a top plan diagrammatic view of an inductor SAP.

FIG. 7 shows a top plan diagram of a spiral inductor SAP 80. SAP 80 has a carrier film 88 having a spiral inductor formed on it by sputtering and patterning copper into the inductor layer 84. Inductor layer 84 has insulating layer 82 patterned on top of it, covering all of the inductor layer 84 except for contact pads 86. As with resistor and capacitor SAPs, it may be desirable to have gold contact pads to facilitate attachment to a circuit board.

SAP's of the present invention are about 60 μm thick, or less than 3 mils, well under the 6 mil maximum. Reliability testing has been performed on resistor and capacitor SAP's. Testing included 1000 hours of thermal annealing at 125° C., 1000 thermal shock cycling from −55° C. to 125° C., and 1000 hours of temperature/humidity storage at 85° C. and 85% humidity. The test results show that the devices can survive all of these thermal tests. Chrome silicide resistors and tantalum oxide capacitors were fabricated on flexible polyimide substrates and mounted under IC packages. Reliability testing was performed on the chain, resistor, and capacitor SAP test vehicles. Testing included 1000 hours of thermal annealing at 125° C., 1000 thermal shock cycling from −55° C. to 125° C., and 1000 hours of temperature/humidity storage at 85° C. and 85% humidity. The test results indicate that the devices can survive all of these thermal tests.

The SAP's of the present invention may be attached to a variety of different types of circuit boards including PWB, PCB, flex board, flexible film, flexible substrates, surface mount component substrates, bare chip substrates, ceramic, glass, metal, other interconnect substrates, and the like.

SAP's of the present invention may be secured or attached to the PWB or other circuitry by solder, conductive pastes, silver-epoxy, sinterable Cu paste (Ormet), other curable conductive pastes, conductive adhesives, thermally reflowing materials, sonic or ultrasonic adhesion, light activated adhesion and the like. Those skilled in the art will appreciate that there are a variety of materials suitable for attaching small circuits to circuit boards such as those listed above. In order to enhance the adhesion of the SAP to the PWB, one can add dummy attachment pads like pads 34 shown in FIG. 4. Attachment pads may be the shape of points, bars, outlines, or the like and increase the adhesion of the SAP to the PWB especially around the edges of the SAP.

Figure 8:
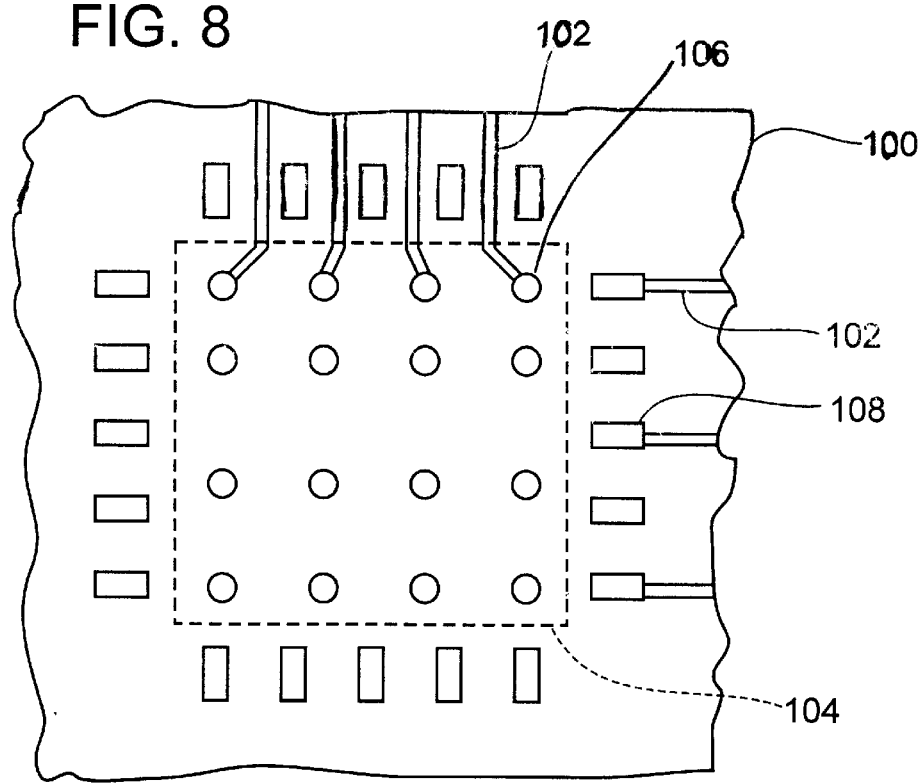
FIG. 8 is a top plan view of a circuit board designed to have a SAP attached to it.

FIG. 8 shows a diagram of circuitry printed onto a circuit board designed to have a SAP attached. Circuit board 100 has printed circuit traces 102 fabricated on it by conventional methods. Some circuit traces 102 include contact points 106 where contact pads on the SAP will conductively contact the printed circuitry 102 via solder, conductive epoxy, or other materials known to those skilled in the art. The outline of the SAP is indicated as 104. In this case 16 attachment pads 106 are shown, which would connect to 8 independent passive circuit elements on the SAP. Of course different configurations of pads and circuitry are possible. In addition, some circuit traces 102 terminate in conductive contact points 108, which are the PWB pads required for connecting to the leads of the IC package that will sit above the SAP. In this case 20 pads are provided, but this would be dictated by the IC to be attached.

For applying solder on the pads of the PWB, screen-printing using a solder stencil is the preferred method for transfer to high volume production. Typical stencil thickness used in industry is 6 mil but because of the thin solder connections and the small pad geometries used in the present invention, a 4 mil thick stencil should be used. This stencil thickness allows adequate solder screen-printing on the larger package pads and the smaller SAP connection pads. In determining the stencil thickness and the pad sizes, the aspect ratio and the surface tension ratio of the solder has to be considered. Additionally, the solder volume applied to the pads was approximately 2 mil in height after reflow. Because SAP's typically are sandwiched between the circuit board and IC packages, they sometimes are not adequately heated during reflow. To assure that solder contact points are adequately heated, it may be desirable to utilize a hot plate underneath the circuit board during reflow. A small aluminum wafer may be placed on the bottom of the circuit board where the SAP is, thereby locally increasing the heat underneath the SAP.

Solder reflow doubles as an alignment process for the SAP's to the substrate. Before reflow, there is usually a slight misalignment between the contacts of the patches and substrate. However, due to the surface tension between the solder and the copper or gold contact pads exposed through the passivation layer, the solder pulled the patch into perfect alignment to the substrate. Contact pads distributed along the periphery of the SAP aid in this alignment. A large vacuum chuck for the patches can ensure the flatness of the patch during bonding.

An important aspect of the invention is that the most likely use of SAP's does not impact the normal PWB assembly process, which consists of screen printing solder paste, followed by the placement of components such as SMD's and IC packages by automated manufacturing equipment known as "pick and place" equipment. The SAP is treated the same way an IC package would be treated; it is picked out of a carrier by a vacuum chuck and placed on its solder paste-coated attachment pads on the PWB. In a subsequent step, the corresponding IC package is positioned on its pads as shown in FIG. 7. All solder connections are "reflowed" at the same time in the normal manufacturing process. Multiple solder reflow steps are not required.

Whereas, the present invention has been described in relation to the drawings attached hereto, it should be understood that other and further modifications, apart from those shown or suggested herein, may be made within the spirit and scope of this invention.

What is claimed is:

1. A passive electronic circuit device comprising:
   a carrier comprised of a nonconductive, thin polymer film having a top and a bottom;
   at least one passive electronic circuit element attached to the bottom of the carrier;
   at least two contact pads allowing said passive electronic circuit element to be conductively attached to an electronic circuit board;
   wherein, the thickness of said passive electronic circuit device is less than 0.008 inches.

2. The device of claim 1 further comprising a passivation layer to prevent contact between non-contact pad areas of said passive electronic circuit element and said circuit board or interconnection medium, and to define said contact pads.

3. The device of claim 1, wherein said at least one passive electronic circuit is comprised of multiple passive electronic circuit elements.

4. The device of claim 1, wherein said passive electronic circuit element is selected from the group consisting of a parallel plate capacitor, a resistor, a floating plate capacitor, or an inductor.

5. The device of claim 1, wherein said device is attached to an electronic circuit board and is located underneath a device selected from the group consisting of an integrated circuit, or a leaded or non-leaded integrated circuit package.

6. The device of claim 1, wherein said thickness of said device is less than 0.006 inches.

7. An electronic assembly comprising:

a printed wiring board with a plurality of connection pads for mounting at least one integrated circuit package and a plurality of connection pads for mounting at least one passive device, said passive device connection pads lying within the board surface area bounded by the inside edges of said integrated circuit connection pads; and a passive device, consisting of at least one passive circuit element and at least two connection pads to said circuit element, said element and connection pads disposed on one side of a non-conductive thin polymer film carrier, said connection pads soldered to corresponding ones on said printed wiring board; and an integrated circuit package, said package having connecting regions comprising leads or solder pads or solder balls, said connecting regions soldered to corresponding ones on said printed wiring board.

8. The assembly of claim 7 wherein said passive device is less than 0.006" thick.

9. The assembly of claim 8 wherein said integrated circuit package has a clearance between said package bottom and said printed wiring board of at least 0.006".

10. The device of claim 7 wherein the thin polymer film is selected from the group consisting of mylar, polyimide, polyvinyl chloride, polyvinyl fluoride, polyester, nylon, liquid crystal polymer, or teflon.

* * * * *